United States Patent
Oratti Kalandar et al.

(10) Patent No.: US 9,508,632 B1
(45) Date of Patent: Nov. 29, 2016

(54) APPARATUS AND METHODS FOR STACKABLE PACKAGING

(71) Applicant: FREESCALE SEMICONDUCTOR, INC., Austin, TX (US)

(72) Inventors: Navas Khan Oratti Kalandar, Austin, TX (US); Nishant Lakhera, Austin, TX (US); Varughese Mathew, Austin, TX (US); Akhilesh K. Singh, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/749,243

(22) Filed: Jun. 24, 2015

(51) Int. Cl.
| | |
|---|---|
| *H01L 23/495* | (2006.01) |
| *H01L 23/02* | (2006.01) |
| *H01L 23/48* | (2006.01) |
| *H01L 23/52* | (2006.01) |
| *H01L 29/40* | (2006.01) |
| *H01L 23/31* | (2006.01) |
| *H01L 23/00* | (2006.01) |
| *H01L 21/56* | (2006.01) |

(52) U.S. Cl.
CPC ....... *H01L 23/49548* (2013.01); *H01L 21/565* (2013.01); *H01L 23/3107* (2013.01); *H01L 23/49503* (2013.01); *H01L 24/49* (2013.01); *H01L 2224/023* (2013.01); *H01L 2224/0233* (2013.01); *H01L 2224/0235* (2013.01); *H01L 2224/08145* (2013.01); *H01L 2224/3003* (2013.01); *H01L 2224/32145* (2013.01); *H01L 2224/3303* (2013.01); *H01L 2224/48247* (2013.01); *H01L 2225/06503* (2013.01); *H01L 2225/06527* (2013.01); *H01L 2225/1011* (2013.01); *H01L 2225/1041* (2013.01); *H01L 2225/1047* (2013.01); *H01L 2924/19102* (2013.01); *H01L 2925/0655* (2013.01)

(58) Field of Classification Search
CPC ................ H01L 2224/023; H01L 2224/0233; H01L 2224/0235; H01L 2224/0237; H01L 2224/02373; H01L 2224/08145; H01L 2224/08148; H01L 2224/32145; H01L 2224/32147; H01L 2224/32148; H01L 2224/3003; H01L 2224/3303; H01L 2225/1041; H01L 2225/1047; H01L 2225/06503; H01L 2225/06527; H01L 2225/1011; H01L 2225/1029; H01L 23/49503; H01L 2924/19102; H01L 2925/0655

USPC ........ 257/672, 676, 686, 693, 696, 775, 777
See application file for complete search history.

(56) References Cited

U.S. PATENT DOCUMENTS

| | | | | |
|---|---|---|---|---|
| 5,365,107 A * | 11/1994 | Kuraishi | ............. | H01L 23/4334 257/673 |
| 5,410,451 A * | 4/1995 | Hawthorne | ............. | H01L 23/16 174/260 |
| 6,043,430 A * | 3/2000 | Chun | ................... | H01L 23/3107 174/530 |
| 6,329,705 B1 * | 12/2001 | Ahmad | ................... | H01L 23/16 257/666 |
| 6,337,510 B1 | 1/2002 | Chun-Jen et al. | | |
| 6,664,614 B2 * | 12/2003 | Kim | ................... | H01L 23/49555 257/666 |
| 6,784,525 B2 * | 8/2004 | Kuan | ................... | H01L 23/3128 257/676 |
| 7,476,962 B2 | 1/2009 | Kim | | |
| 7,777,315 B2 * | 8/2010 | Noquil | ................ | H01L 23/4334 257/666 |
| 2008/0182434 A1 | 7/2008 | Goida | | |

* cited by examiner

*Primary Examiner* — Teresa M Arroyo

(57) ABSTRACT

A semiconductor structure includes a lead frame having a flag and a plurality of leads, a semiconductor die attached to a first major surface of the flag, and a plurality of re-routed lead fingers attached to the lead frame. The plurality of leads has a first pitch. The first end of each re-routed lead finger is attached to a lead of the plurality of leads. Each re-routed lead finger extends over the semiconductor die such that a second end of each re-routed lead finger is over and spaced apart from the flag of the lead frame. The second ends of the plurality of re-routed lead fingers has a second pitch different from the first pitch.

16 Claims, 6 Drawing Sheets

APPARATUS AND METHODS FOR STACKABLE PACKAGING

BACKGROUND

Field

This disclosure relates generally to semiconductor device packaging, and more specifically, to quad flat no lead packages stacked with other packaged semiconductor devices.

Related Art

Lead frames provide a central supporting structure of molded IC packages to which all other elements of the molded IC package are attached. Lead frames are etched or stamped from a thin sheet metal strip to form a pattern of terminals around a central die attach platform upon which a die is mounted using, for example, an epoxy resin. The die includes bonding pads which are electrically connected to the surrounding lead terminals of the frame by fine-diameter conductive wires using well-established wire bond techniques. The assembly including the lead frame, die, and wires are covered with a thermoset plastic casing to complete the molded IC package.

Array quad flat no lead (QFN) and power QFN (PQFN) packages typically comprise an integrated circuit (IC) die attached and electrically connected to a lead frame with more than one rows of lead terminal. The IC die, the electrical connections and a portion of the lead frame are encapsulated by a mold compound, leaving a portion of the leads exposed. The exposed leads serve as input and output (IO) connections to the encapsulated IC die and are typically located along a periphery of the QFN package. Because QFN packages provide a number of advantages over other lead frame package configurations including, for example, shorter electrical paths and faster signal communication rates, QFN packages are widely used as low pin count solutions for power elements and other IC die.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Apparatus and methods disclosed herein provide a quad flat no lead (QFN) package reinforced with a frame cap (also referred to as "re-routed lead fingers"). The frame cap is etched or pre-formed to have multiple fingers on the top side and is used to stack another packaged device on top of the QFN package. The frame cap can be attached to the QFN lead frame using solder or electrically conductive adhesive. The fingers can be routed inward to accommodate different package sizes and lead pitches. The second package can be QFN, land grid array (LGA), ball grid array (BGA), wafer level chip scale package (WLCSP), micro-electro-mechanical sensor (MEMS) package or other suitable package type.

Figure 1:
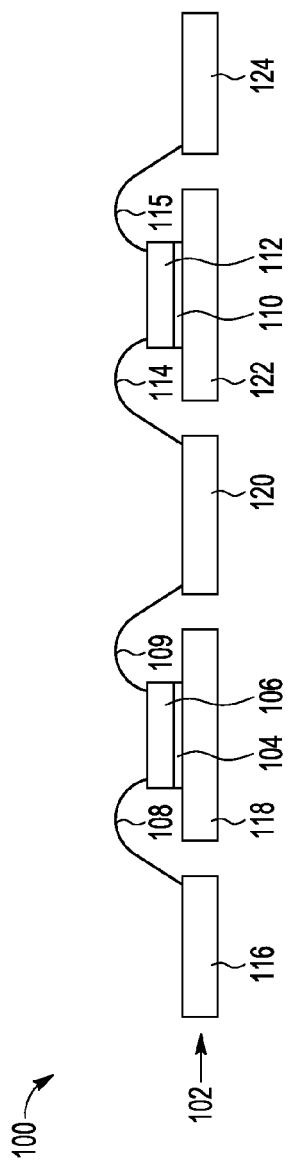
FIGS. 1-5 show a cross-sectional side view of an embodiment of a semiconductor assembly during successive stages of manufacture.

Referring now to FIG. 1, a cross-sectional side view of an embodiment of a semiconductor assembly 100 during an intermediate stage of manufacture including lead frame 102 for a quad flat no lead (QFN) package with semiconductor die 106, 112 mounted on die attach areas (also referred to as "die flags") 118, 122 of lead frame 102 with die attach material 104, 110. Contacts or leads 116, 120, 124 are spaced from peripheral edges of die flags 118, 122. Wire bonds 108, 109, 114, 115 are formed between a contact on a surface of die 106, 112 and respective leads 116, 120, 124 on lead frame 102. Die flags 118, 122 are sized and shaped to receive one or more integrated circuit (IC) dies or other components. IC die 106, 112 may include any type of circuitry that performs any suitable type of function such a System on a Chip, microprocessor, memory, sensor, or other suitable circuitry. Die attach material 104, 110 may be any suitable material such as epoxy, tape, solder, or other suitable material.

In addition to being connected to die 106, 112, leads 116, 120, 124 can be connected to contacts or leads on other components during later stages of processing to allow the components in assembly 100 to operate with components in other packages on a printed circuit board, or other devices.

Note that although lead frame 102 is shown with two die flags 118, 122 in FIGS. 1-5, lead frame 102 can include any suitable number of die flags 118, 122 and can be arranged with a two dimensional matrix of die flags 118, 122.

Figure 2:
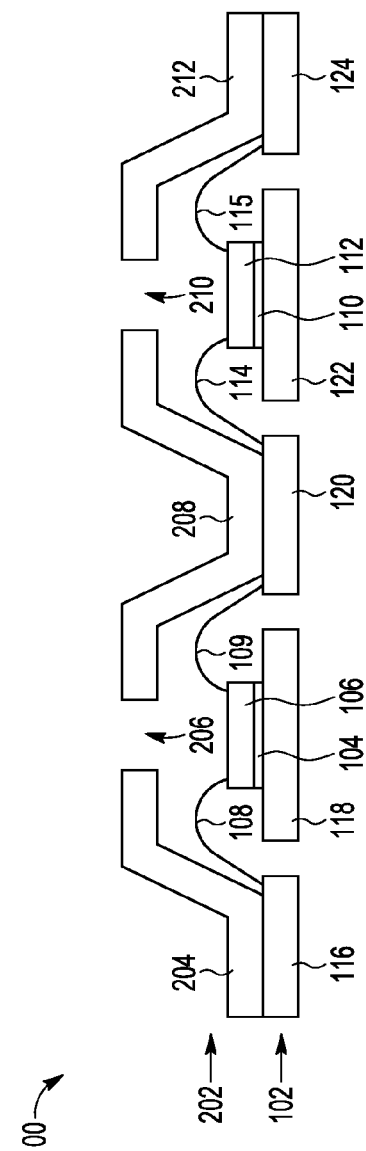

FIG. 2 shows a cross-sectional side view of the semiconductor assembly 100 of FIG. 1 after a successive stage of manufacture in which frame cap or re-routed lead fingers—202 are attached to lead frame 102. A portion of a first re-routed lead finger 204 is coupled to lead 116 of lead frame 102. A portion of a second re-routed lead finger 208 is coupled to lead 120 of lead frame 102. A portion of a third re-routed lead finger 212 is coupled to lead 124 of lead frame 102. Re-routed lead fingers 202 may be attached to lead frame 102 using any suitable material such as solder, electrically conductive adhesive, or other suitable electrically conductive material. One end of lead finger 204 is separated from one end of lead finger 208 by space 206. One end of lead finger 208 is separated from one end of lead finger 212 by space 210.

Re-routed lead finger 204 includes a first portion that is attached to lead 116, a second portion that extends at an angle between twenty and ninety degrees from the surface of frame 102 sufficient to clear wire bond 108, and a third portion that is parallel to lead frame 102 and extends over and is spaced apart from a portion of die flag 118.

Re-routed lead finger 208 includes a first portion that is attached lead 120, a second portion that extends from one side of the first portion at an angle between ninety and one-hundred sixty degrees from the surface of frame 102 toward die flag 118 sufficient to clear wire bond 109, a third portion that is parallel to lead frame 102 and extends over and is spaced apart from a portion of die flag 118, a fourth portion that extends from the first portion toward die flag 122 at an angle between twenty and ninety degrees from the surface of frame 102 sufficient to clear wire bond 114, and a fifth portion that is parallel to lead frame 102 and extends over and is spaced apart from a portion of die flag 122.

Re-routed lead finger 212 includes a first portion that is attached to lead 124, a second portion that extends toward lead 124 at an angle between ninety and one-hundred sixty degrees from the surface of frame 102 sufficient to clear wire bond 115, and a third portion that is parallel to lead frame 102 and extends over and is spaced apart from a portion of die flag 122.

Figure 3:
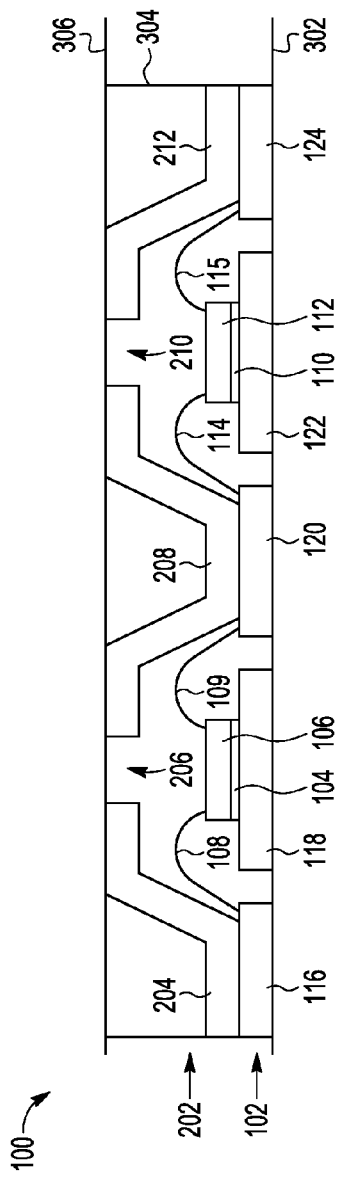

FIG. 3 shows a cross-sectional side view of the semiconductor assembly of FIG. 2 after a successive stage of manufacture during which lead frame 102, lead fingers 202, die 106, 112 and wire bonds 108, 109, 114, 115 are encased or encapsulated in mold compound 304. Removable tape 302 can be positioned on the backside of lead frame 102 to provide support for lead frame 102 and help prevent flash burrs during encapsulation. Tape 302 can be positioned before attaching die 106, 112, forming wire bonds 108, 109, 114, 115 and encapsulating assembly 100. The encapsulation can be performed by a variety of difference processes, such as, for example, transfer molding, film assisted molding, compression molding, or any other suitable encapsulation process. Another layer of film or tape 306 can be positioned over the top of lead fingers 202 to prevent mold compound from covering the top of lead fingers 204, 208, 212. Alternatively, tape 306 may not be used and any mold compound that covers the top surfaces of lead fingers 202 can be removed by chemical-mechanical polishing or other suitable mold compound removal method.

Figure 4:
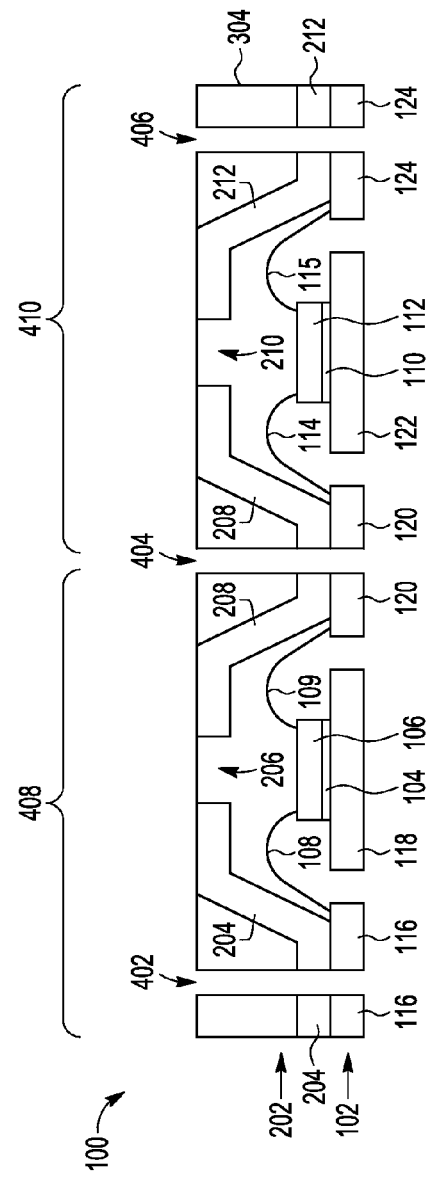

FIG. 4 shows a cross-sectional side view of the semiconductor assembly 100 of FIG. 3 after a successive stage of manufacture during which tape 302, 306 is removed and assembly 100 is singulated into multiple stacked devices 408, 410. A first singulation cut 402 is made through lead 116 and lead finger 204 where lead 116 is attached to lead finger 204. A second singulation cut 404 is made through lead 120 and lead finger 208 where lead 120 is attached to lead finger 208. A third singulation cut 406 is made through lead 124 and lead finger 212 where lead 124 is attached to lead finger 212. Mold compound 304 is also removed when singulation cuts 402-406 are made so that stacked device 408 is completely separated from stacked device 410.

Figure 5:
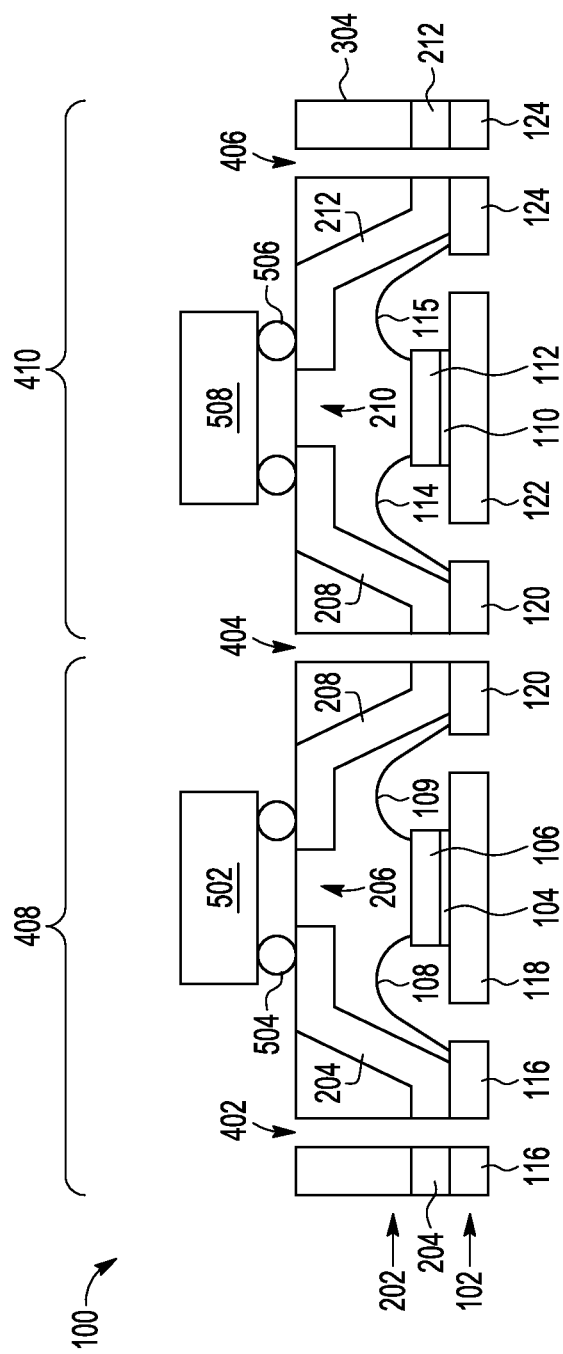

FIG. 5 shows a cross-sectional side view of the semiconductor assembly 100 of FIG. 4 after a successive stage of manufacture during which packaged devices 502, 508 are mounted on top of an exposed surface of respective lead fingers 204, 208, 212 in stacked devices 408, 410. Interconnects 504, 506 made of solder or other electrically conductive material capable of attaching packaged devices 502, 508 on lead fingers 202 are positioned between lead fingers 204, 208, 212 and packaged devices 502, 508. Packaged devices 502, 508 can be wafer level chip scale packages (WLSCP) that are used for a wide range of semiconductor devices such as RF devices, FPGAs, power management, microprocessors, Flash/EEPROM, integrated passive networks, and analog circuitry, among others.

Figure 6:
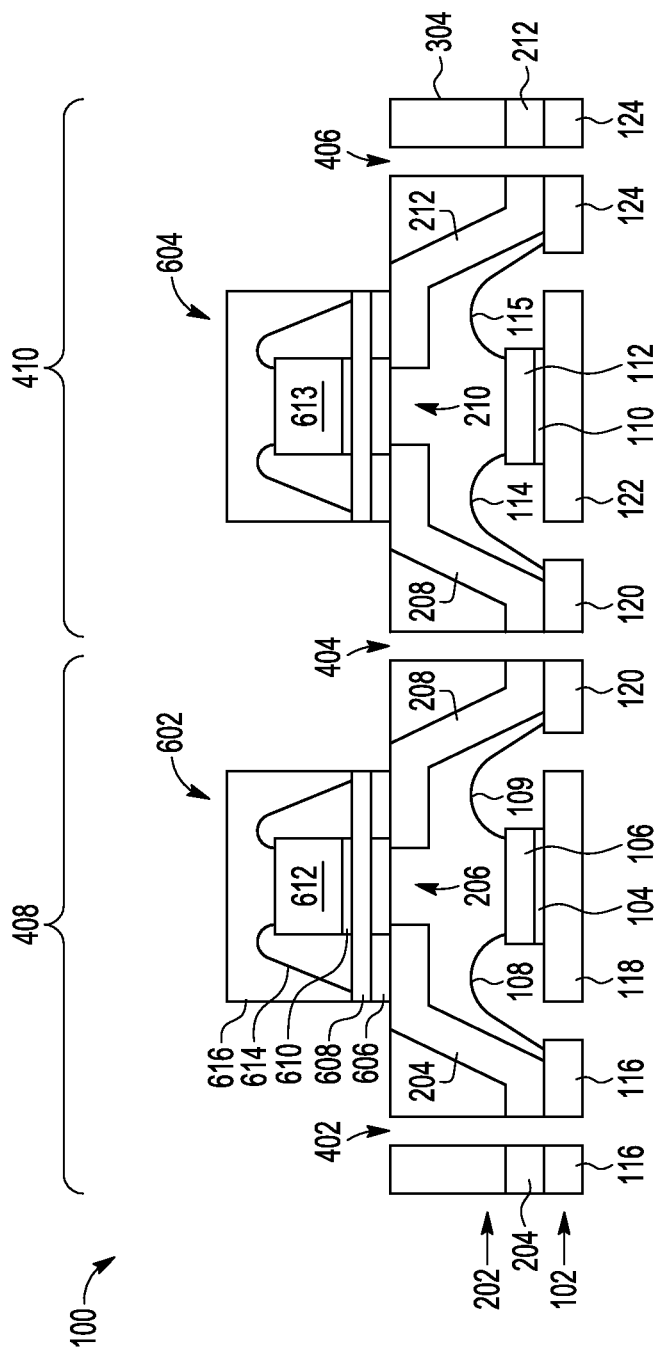
FIG. 6 shows a cross-sectional side view of another embodiment of a semiconductor assembly.

FIG. 6 shows a cross-sectional side view of another embodiment of a semiconductor assembly 100 of FIG. 4 after a successive stage of manufacture during which land grid array (LGA) packaged devices 602, 604 are mounted on top of an exposed surface of respective lead fingers 204, 208, 212 in stacked devices 408, 410. Since packaged device 602 is similar to packaged device 604, only the details of components of stacked device 602 will be described. Contact pads 606 made of solder or other electrically conductive material capable of attaching packaged devices 602, 604 on respective lead fingers 204, 208, 212 are positioned between lead fingers 204, 208, 212 and packaged devices 602, 604. Substrate 608 of packaged device 602 is coupled to contact pads 606. Integrated circuit (IC) die 612 is mounted on substrate 608 with die attach material 610. Bond pads (not shown) on substrate 608 are spaced from peripheral edges of die 612. Wire bonds 614 are formed between a contact on a surface of die 612 and the bond pads on substrate 608. Through hole vias (not shown) in substrate 608 can be used to couple wire bonds 614 to contact pads 606. Mold compound 616 (similar to mold compound 314 in FIG. 3) can be used to encase IC die 612 and wire bonds 614 in protective covering. IC die 106, 112 may include any type of circuitry that performs any suitable type of function such a System on a Chip, microprocessor, memory, sensor, analog circuitry, power management, RF devices, FPGAs, or other suitable circuitry. Die attach material 610 may be any suitable material such as epoxy, tape, solder, or other suitable material.

Figure 7:
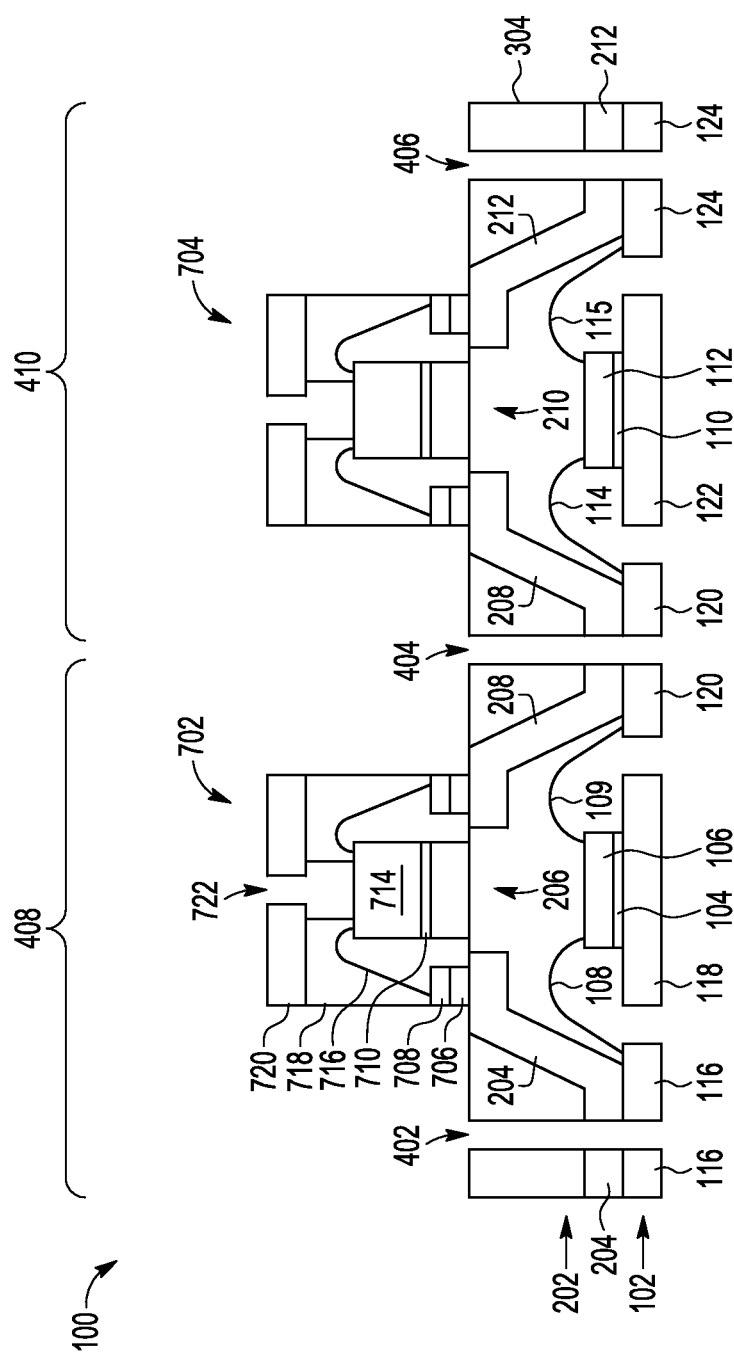
FIG. 7 shows a cross-sectional side view of another embodiment of a semiconductor assembly.

FIG. 7 shows a cross-sectional side view of another embodiment of a semiconductor assembly 100 of FIG. 4 after a successive stage of manufacture during which packaged microelectromechanical (MEMS) devices 702, 704 are mounted on top of an exposed surface of respective lead fingers 204, 208, 212 in stacked devices 408, 410. Since packaged device 702 is similar to packaged device 704, only the details of components of stacked device 702 will be described. Contact pads 706 made of solder or other electrically conductive material capable of attaching packaged devices 702, 704 on respective lead fingers 204, 208, 212 are positioned between lead fingers 204, 208, 212 and packaged devices 702, 704. Sensor die or component 714 is attached to lead frame 708 including lead contacts and a central die flag. Sensor component 714 is coupled to lead frame 780 with die attach material 710. Die attach material 710 may be any suitable material such as epoxy, tape, solder, or other suitable material. Wire bonds 716 are formed between contacts on lead frame 708 and the bond pads on sensor component 714. Mold compound 718 (similar to mold compound 314 in FIG. 3) can be used to encase wire bonds 716 and at least a portion of sensor component 714 in protective covering. A cap or lid 720 can be mounted on a top surface of mold compound 718 and may include an opening 722 aligned with an opening in mold compound 718 to enable a characteristic or substance in the ambient environment to come into contact with and/or be sampled by sensor component 714. Cap 720 may be made of transparent or opaque material, depending on the purpose for which MEMS device 702 is being used. MEMS devices 702, 704 can include other components in addition to or instead of the components shown in FIG. 7, as required. Some examples of sensors that can be implemented in MEMS device 702, 704 include pressure sensors, gyroscopes, accelerometers, biosensors, chemosensors, and transducers, among others.

Note that a variety of different package types 502, 508, 602, 604, 702, 704 have been shown for the upper device. It is contemplated that other package types, such as packages containing a flip chip or other suitable configuration or device, can be used for the bottom package.

Figure 8:
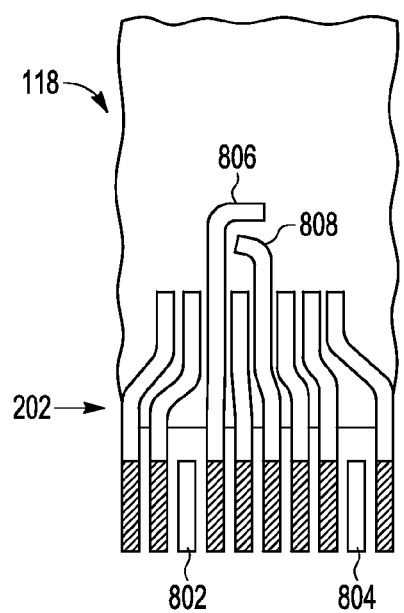
FIG. 8 shows a top view of an embodiment of one edge portion of the lead frame in FIGS. 2-7 overlaid with rerouted lead fingers.
Figure 9:
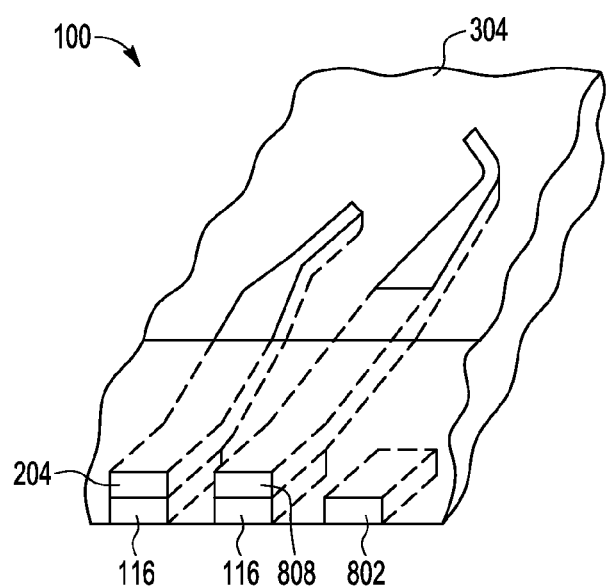
FIG. 9 shows a perspective view of an embodiment of an edge of a stacked assembly with lead fingers of a lead frame overlaid with rerouted lead fingers.

Referring now to FIGS. 8 and 9, FIG. 8 shows a top view of an embodiment of one edge portion of lead frame 102 for a QFN package, such as package 100 in FIGS. 2-7, overlaid with rerouted lead fingers 204, 806, 808 for a packaged semiconductor device over the QFN package. FIG. 9 shows a perspective view of an embodiment of portion of an edge of a stacked assembly 900 with lead fingers 116, 802 of lead frame 102 overlaid with rerouted lead fingers 204, 808. In FIG. 8, the portion of lead fingers 116 overlaid with rerouted lead fingers 204, 806, 808 are shown in black. Portions of re-routed lead fingers 204, 806, 808 extend over a portion of die flag 118.

The pitch or width of re-routed lead fingers 204, 806, 808 can change over their length. As shown, the width or pitch of re-routed lead fingers 204, 806, 808 is the same as lead fingers 116 on one end, but become more narrow over the length of lead fingers 204, 806, 808. The narrower pitch allows contacts on packages 502, 508 (FIG. 5), 602, 604 (FIG. 6), 702, 704 (FIG. 7) with a relatively small form factor to be coupled electronically with die 106, 112 having a larger form factor.

Additionally, lead frame 102 may include more lead fingers 116, 802, 804 than re-routed lead fingers 204, 806, 808 on packages 502, 508, 602, 604, 702, 704, depending on the number of signals that need to be communicated between die 106, 112 and components in packages 502, 508, 602, 604, 702, 704. In such cases, some lead fingers 802, 804 of lead frame 102 will not be overlaid with a corresponding re-routed lead finger 204, 806, 808.

As shown in FIG. 9, top surfaces of re-routed lead fingers 204, 806, 808 are exposed at the top surface of mold compound 314 to enable packages 502, 508, 602, 604, 702, 704 to be electronically coupled to die 106, 112. Further, re-routed lead fingers 204, 806, 808 can be shaped or routed in straight, curved, bent, or angled lines at the top surface of packages 502, 508, 602, 604, 702, 704 as well as within packages 502, 508, 602, 604, 702, 704 to reach desired contacts for packages 502, 508, 602, 604, 702, 704. The length of re-routed lead fingers 204, 806, 808 can also vary, as required, to reach components on packages 502, 508, 602, 604, 702, 704.

Note that although stacked devices 408, 410 are shown in the figures with one package 502, 508, 602, 604, 702, 704 stacked over a lower package, stacked devices 408, 410 can include more than two stacked packages.

Further note that although the figures show a limited number of lead fingers, lead frame 102 and packages 502, 508, 602, 604, 702, 704 can include any suitable number of lead fingers 116, 802, 804 and re-routed lead fingers 204, 806, 808.

By now it should be appreciated that in some embodiments, there has been provided a semiconductor structure (100) that can comprise a lead frame (102) having a flag (118) and a plurality of leads (116, 120) having a first pitch, a semiconductor die (106) attached to a first major surface of the flag, and a plurality of re-routed lead fingers (202) attached to the lead frame. A first end of each re-routed lead finger of the plurality of re-routed lead fingers is attached to a lead of the plurality of leads. Each re-routed lead finger extends over the semiconductor die such that a second end of each re-routed lead finger is over and spaced apart from the flag of the lead frame. The second ends of the plurality of re-routed lead fingers has a second pitch different from the first pitch.

In another aspect, the semiconductor structure can further comprise a packaged semiconductor device (502, 602, 702) in electrical contact with the second ends of the plurality of re-routed lead fingers.

In another aspect, the packaged semiconductor device is characterized as one of a wafer level chip scale package, land grid array package, or a micro-electromechanical semiconductor (MEMs) package.

In another aspect, the semiconductor structure can further comprise a mold compound (304) around the semiconductor die and between the second ends of the plurality of re-routed lead fingers and a top surface of the semiconductor die.

In another aspect, the semiconductor structure can further comprise a plurality of wirebond connections (108) between the top surface of the semiconductor die and the plurality of leads of the lead frame.

In another aspect, the plurality of re-routed lead fingers extend over the wirebond connections.

In another aspect, each re-routed lead finger extends from a corresponding lead at an angle less than 90 degrees.

In another aspect, a top surface of the mold compound exposes a portion, including the second end, of each of the plurality of re-routed lead fingers, wherein at least one exposed portion includes a bend (at 806, 808) at the top surface of the mold compound.

In another aspect, the plurality of re-routed lead fingers has fewer re-routed lead fingers than the plurality of leads has leads.

In other embodiments, a semiconductor structure can comprise a lead frame (102) having a flag (118) and a plurality of leads (116, 120), a semiconductor die (106) attached to a first major surface of the flag, and a plurality of re-routed lead fingers (202) attached to the lead frame. A first end of each re-routed lead finger of the plurality of re-routed lead fingers can be attached to a lead of the plurality of leads. At least one lead of the plurality of leads does not have an attached re-routed lead finger. Each re-routed lead finger can extend over the semiconductor die such that a second end of each re-routed lead finger is over and spaced apart from a top surface of the semiconductor die. A mold compound (304) can be around the semiconductor die and between the plurality of re-routed lead fingers and the top surface of the semiconductor die which exposes a portion, including the second end, of each re-routed lead finger. A packaged semiconductor device (502, 602, 702) can be attached over the semiconductor die and in electrical contact with the exposed second ends of the plurality of re-routed lead fingers.

In another aspect, the semiconductor structure can further comprise a plurality of wirebond connections (108) between the top surface of the semiconductor die and the plurality of leads of the lead frame.

In another aspect, the plurality of re-routed lead fingers extend over the wirebond connections.

In another aspect, each re-routed lead finger extends from an attached lead at an angle of 90 degrees or less.

In another aspect, an exposed portion of at least one of the plurality of re-routed lead fingers includes a bend (806, 808) in a plane parallel to the top surface of the semiconductor die.

In another aspect, the plurality of leads has a first pitch and the second ends of the plurality of re-routed lead fingers has a second pitch different from the first pitch.

In another aspect, the exposed portions of at least two of the plurality of re-routed lead fingers have a different length or width.

In another aspect, the plurality of re-routed lead fingers is a preformed structure.

In still other embodiments, a method for forming a stacked semiconductor device can comprise attaching a semiconductor die (106) to a flag (118) of a lead frame (102). The lead frame can have a plurality of leads having a first pitch. A first end of each of a plurality of re-routed lead fingers (202) can be attached to a lead of the plurality of leads. Each re-routed lead finger can extend over the semiconductor die such that a second end of each re-routed lead finger is over and spaced apart from the flag of the lead frame. The second ends of the plurality of re-routed lead fingers can have a second pitch different from the first pitch.

A packaged semiconductor device (502, 602, 702) can be attached to be in electrical contact with the second ends of the plurality of re-routed lead fingers.

In another aspect, the method can further comprise prior to attaching the packaged semiconductor device, forming a mold compound (304) around the semiconductor die and between the second ends of the plurality of re-routed lead fingers and a top surface of the semiconductor die, wherein the mold compound exposes a portion, including the second end, of each re-routed lead finger, and wherein the packaged semiconductor device is in electrical contact with the exposed portions of the re-routed lead fingers.

In another aspect, the plurality of re-routed lead fingers has fewer re-routed lead fingers than the plurality of leads has leads.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor structure comprising:
a lead frame having a flag and a plurality of leads, the plurality of leads having a first pitch;
a semiconductor die attached to a first major surface of the flag; and
a plurality of re-routed lead fingers attached to the lead frame, wherein:
a first end of each re-routed lead finger of the plurality of re-routed lead fingers is attached to a lead of the plurality of leads,
each re-routed lead finger extends over the semiconductor die such that a second end of each re-routed lead finger is over and spaced apart from the flag of the lead frame, and
the second ends of the plurality of re-routed lead fingers has a second pitch different from the first pitch;
a mold compound around the semiconductor die and between the second ends of the plurality of re-routed lead fingers and a top surface of the semiconductor die; and
a plurality of wirebond connections between the top surface of the semiconductor die and the plurality of leads of the lead frame, wherein the plurality of re-routed lead fingers extend over the plurality of wirebond connections.

2. The semiconductor structure of claim 1, further comprising:
a packaged semiconductor device in electrical contact with the second ends of the plurality of re-routed lead fingers.

3. The semiconductor structure of claim 2, wherein the packaged semiconductor device is characterized as one of a wafer level chip scale package, land grid array package, or a micro-electromechanical semiconductor (MEMs) package.

4. The semiconductor structure of claim 1, wherein each re-routed lead finger extends from a corresponding lead at an angle less than 90 degrees.

5. The semiconductor structure of claim 1, wherein a top surface of the mold compound exposes a portion, including the second end, of each of the plurality of re-routed lead fingers, wherein at least one exposed portion includes a bend at the top surface of the mold compound.

6. The semiconductor structure of claim 1, wherein the plurality of re-routed lead fingers has fewer re-routed lead fingers than the plurality of leads has leads.

7. A semiconductor structure comprising:
a lead frame having a flag and a plurality of leads;
a semiconductor die attached to a first major surface of the flag;
a plurality of re-routed lead fingers attached to the lead frame, wherein:
a first end of each re-routed lead finger of the plurality of re-routed lead fingers is attached to a lead of the plurality of leads, wherein at least one lead of the plurality of leads does not have an attached re-routed lead finger, and
each re-routed lead finger extends over the semiconductor die such that a second end of each re-routed lead finger is over and spaced apart from a top surface of the semiconductor die; and
a mold compound around the semiconductor die and between the plurality of re-routed lead fingers and the top surface of the semiconductor die which exposes a portion, including the second end, of each re-routed lead finger; and
a packaged semiconductor device over the semiconductor die and in electrical contact with the exposed second ends of the plurality of re-routed lead fingers.

8. The semiconductor structure of claim 7, further comprising:
a plurality of wirebond connections between the top surface of the semiconductor die and the plurality of leads of the lead frame.

9. The semiconductor structure of claim 8, wherein the plurality of re-routed lead fingers extend over the plurality of wirebond connections.

10. The semiconductor structure of claim 9, wherein each re-routed lead finger extends from an attached lead at an angle of 90 degrees or less.

11. The semiconductor structure of claim 7, wherein an exposed portion of at least one of the plurality of re-routed lead fingers includes a bend in a plane parallel to the top surface of the semiconductor die.

12. The semiconductor structure of claim 7, wherein the plurality of leads has a first pitch and the second ends of the plurality of re-routed lead fingers has a second pitch different from the first pitch.

13. The semiconductor structure of claim 7, wherein the exposed portions of at least two of the plurality of re-routed lead fingers have a different length or width.

14. The semiconductor structure of claim 7, wherein the plurality of re-routed lead fingers is a preformed structure.

15. A method for forming a stacked semiconductor device, comprising:
attaching a semiconductor die to a flag of a lead frame, wherein the lead frame has a plurality of leads having a first pitch;
attaching a first end of each of a plurality of re-routed lead fingers to a lead of the plurality of leads, wherein each re-routed lead finger extends over the semiconductor die such that a second end of each re-routed lead finger is over and spaced apart from the flag of the lead frame, and wherein the second ends of the plurality of re-routed lead fingers has a second pitch different from the first pitch, wherein the plurality of re-routed lead fingers has fewer re-routed lead fingers than the plurality of leads has leads; and
attaching a packaged semiconductor device to be in electrical contact with the second ends of the plurality of re-routed lead fingers.

16. The method of claim 15, further comprising:
prior to attaching the packaged semiconductor device, forming a mold compound around the semiconductor die and between the second ends of the plurality of re-routed lead fingers and a top surface of the semiconductor die, wherein the mold compound exposes a portion, including the second end, of each re-routed lead finger, and wherein the packaged semiconductor device is in electrical contact with the exposed portions of the re-routed lead fingers.

\* \* \* \* \*